United States Patent [19]

Bean

[11] 3,769,562

[45] Oct. 30, 1973

[54] DOUBLE ISOLATION FOR ELECTRONIC DEVICES

[75] Inventor: Kenneth E. Bean, Richardson, Tex.

[73] Assignee: Texas Instruments Incorporated, Dallas, Tex.

[22] Filed: Feb. 7, 1972

[21] Appl. No.: 223,905

[52] U.S. Cl. .............................. 317/235 R, 317/235
[51] Int. Cl. .............................................. H01l 7/00
[58] Field of Search ......................... 317/234; 346/76

[56] References Cited

UNITED STATES PATENTS

| | | | |
|---|---|---|---|
| 3,623,218 | 11/1971 | Mitarai et al. | 29/577 |
| 3,486,892 | 12/1969 | Rosvold | 96/36.2 |

*Primary Examiner*—John S. Heyman
*Assistant Examiner*—E. Wojciechowicz
*Attorney*—Harold Levine et al.

[57] ABSTRACT

A thermally and electrically isolated array of islands or mesas of semiconductor material and method of fabrication are provided wherein each island or mesa is surrounded by moats formed by either orientation-dependent etching or, space permitting, by standard multiple-dependent techniques. These moats have a "W"-shaped cross-section surrounding each island or mesa. Such an array of islands or mesas is especially adapted for use in the fabrication of high voltage or high power integrated circuit devices, and thermal print heads.

3 Claims, 11 Drawing Figures

DOUBLE ISOLATION FOR ELECTRONIC DEVICES

BACKGROUND OF THE INVENTION

This invention relates to the fabrication of high voltage or power integrated circuit semiconductor devices and more particularly to the fabrication of thermally and electrically isolated mesas or islands for high voltage or power circuit components, and to methods of making an array of islands or mesas with each island or mesa electrically and thermally isolated from adjacent islands or mesas.

Although it will be understood that the various embodiments of this invention have wide application, it will be described and considered principally in connection with an array of mesas for a thermal printer, each meas containing at least one heating element and being designed to contact and mark thermally sensitive material so as to provide a display of characters or symbols. Generally an array of these elements mounted on an insulating substrate are employed to print desired characters or symbols by providing sufficient power to selected elements so as to raise the selected mesas to printing temperatures. Recently, however, each heater element has been included in a very small isolated semiconductor mesa or body so that when energized a "hot spot" is formed at the top surface of the mesa to provide a localized dot of heat. Information is provided by selectively forming hot spots from an array thereof to form an alphanumerical representation and pressing the hot spots against the heat sensitive paper or against a transferable coating to transfer print to paper.

The method of constructing the mesas for these hot spots has utilized an orientation-dependent etch for etching a single moat around each mesa on the surface of a semiconductor wafer having a {100} crystal orientation. An oxide mask has been aligned parallel to the {111} intersects and the orientation-dependent etch process has been permitted to continue to its normal stopping point which is the intersection of the {111} planes. This method, however, suffers several disadvantages; e.g., if the width of the gap is inadequate a "bleeding" (print smearing) occurs due to thermal leakage between the dielectric isolation of the "hot spots" or dots; and if the moat is made wide enough the etching must be prematurely stopped to obtain a desired mesa depth. Prematurely stopping the etching process diminishes control of the etching process; that is, if a moat of 1.7 to 2.1 mils depth and width of 5 mils is desired a {100} crystal orientation will etch 5 times 0.707 or 3.53 mils deep before etching is practically terminated through intersection of the {111} planes. Thus, to obtain the desired depth the etching process must be stopped short of reaching the {111} intersects and a flat bottom moat is formed. If the greater depth is used, the array structure is weakened which enhances the possibility of breakage through normal usage and especially in the case of thermal printers where "boulders" in the printing paper are struck. Further, in the case of thermal printers, the depth of the mesas is critical to power consumption of the heating elements and to the life of the print head.

SUMMARY OF THE INVENTION

It is an object of this invention to provide a method of fabricating an array of semiconductor islands for a high-voltage or high-power integrated circuit.

It is another object of this invention to provide an improved mesa or island array for a high-voltage or a high-power integrated circuit.

It is yet another object of this invention to provide an array of mesas having increased structural strength.

It is still another object of this invention to provide an array of mesas having high thermal impedance between each pair of mesas.

It is a further object of this invention to provide an improved thermal printing head for a thermal printer of any size print.

It is yet a further object of this invention to provide a thermal printing head having added thermal isolation between islands, while maintaining optimum thermal contact to the paper.

It is still yet a further object of this invention to provide a method of fabricating a thermal print head which is controllable to give the optimum thermal gradient, head strength and lead protection.

Briefly stated, an embodiment of this invention includes an array of mesas, each mesa separated by two or more narrow isolation moats. If a double, or "W"-shaped, isolation moat is used, twice as much isolation oxide and twice as many interfaces for thermal impedance between each heat print element are obtained. The method of this embodiment involves the use of orientation-dependent etching to remove silicon from two adjacent rings on a body of silicon having a surface of any desired orientation. For example, a surface oriented in the {100} plane is described to provide "W"-shaped grooves or channels of the array of mesa-shaped thermally isolated regions. It will be understood that moats having more than two rings may be formed if desired. A suitable etch solution comprising potassium hydroxide, propanol, and water removes silicon from such an oriented silicon surface in a direction normal to the {100} plane surface of the semiconductor wafer at a well controlled rate in the range of 0.5 to 1.5 microns per minute, depending on the temperature and rate of agitation. The solution does not appreciably attack the silicon in a direction normal to the {111} plane. The resulting etched ring areas have flat, well defined, sloping sides forming an angle of approximately 54.7° with the {100} plane. The etched grooves will bottom out at the intersects of the {111} planes into two contiguous "V"-shaped grooves to form the "W"-shaped groove at which time the etch rate drops to essentially zero.

The depth of the "W" groove depends on the width of the two ring openings provided in the etch mask on the wafer surface, and only slightly upon the etching time, if bottoming is complete. For thermal print head purposes the width of each ring opening provided in the etched mask is sufficient to provide etched slots which bottom out below heating elements formed in the mesas thereby electrically isolating an array of mesa-shaped regions and providing necessary thermal isolation by sufficiently spacing apart each mesa of the array of mesa shaped regions.

In another embodiment of the invention where the distance between the moats or islands is not critical, such as, for example, an integrated circuit for a power pack, the double-grooved moat about the island or mesa may be formed by multiple etching the grooves with a non-orientation-dependent etching solution. In this embodiment, to retain the portion of the semiconductor slice dividing the grooves of the moat, the portion must be wider to accommodate the undercutting action of the etching solution. As this embodiment is not concerned with "bleeding," some or all of the polycrystalline material used in fabricating the device as hereinafter described may be left in the moat to form a planar structure. This planar structure will retain the double electrical isolation and thermal impedance between the islands.

DESCRIPTION OF THE PREFERRED EMBODIMENT

Figure 1:
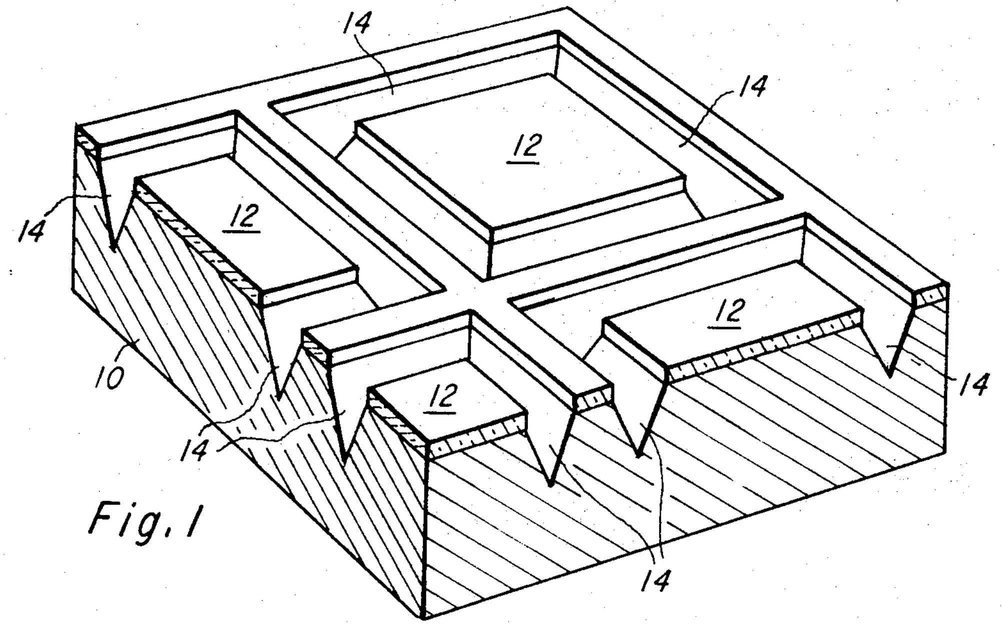
FIG. 1 is a partial isometric view of a mesa array embodying the features of the invention.

FIG. 1 illustrates an array of mesas embodying the invention which comprises a wafer 10 of semiconductor material, silicon for example, having an array of mesas 12 formed therein. It will be understood that the array may be formed of any desired number of mesas 12. The mesas 12 are dielectrically, for example, air- and oxide-isolated from each other by a "W"-shaped moat 14, the fabrication of which will be subsequently described with reference to FIGS. 2 and 3.

Figure 2:
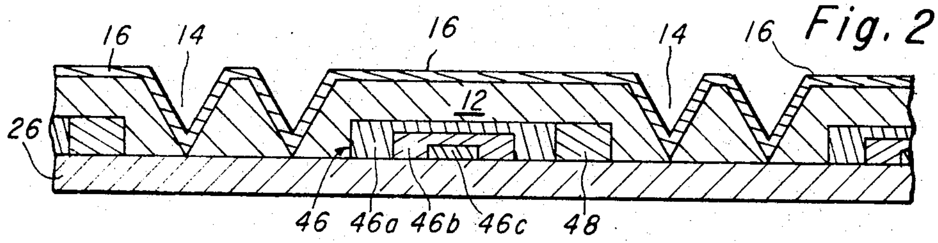
FIG. 2 is an enlarged fragmentary cross-sectional view of a thermal printing head embodying the features of the invention.
Figure 3:
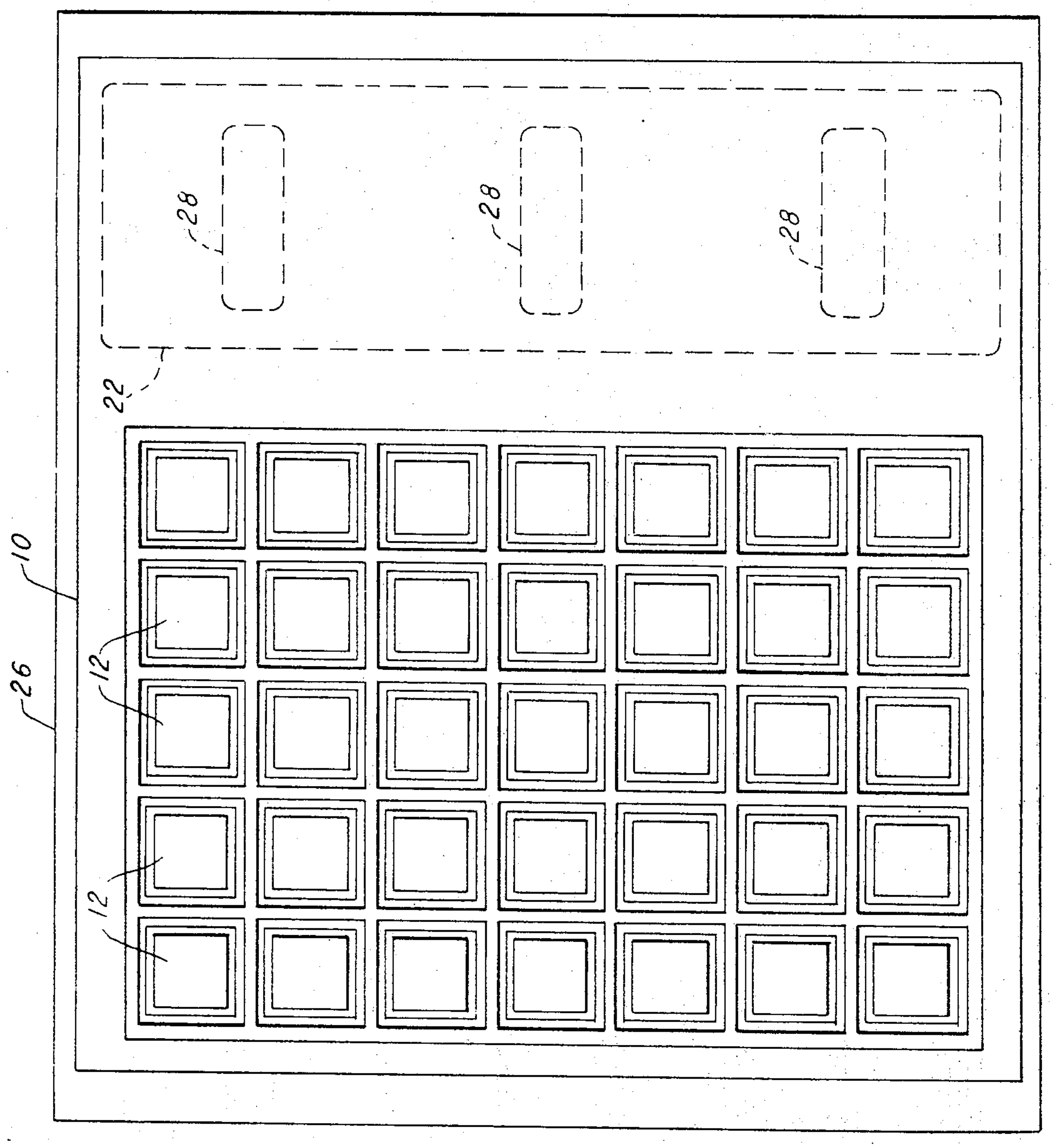
FIG. 3 illustrates an integrated semiconductor heating element array and drive matrix embodying the features of the invention.

A print head array for a thermal printer is shown in FIG. 3 wherein each of the mesas 12 include on a top surface a layer of wear-resistant material 16 (FIG. 2) which may be, for example, silicon carbide, silicon nitride, or silicon dioxide, and adjacent the bottom side a heating element 46 which comprises, for example, a transistor-resistor pair 46–48, a single resistor (not shown), or a resistor-diode pair (not shown). The particular array with the dimensions of the individual mesas are not critical to the invention. In the particular embodiment shown in FIG. 3 and described, however, each array is a 5 × 7 array of printing elements. The heating elements are joined in the desired circuit configuration by a metallic connecting pattern (not shown) underneath the mesas 12. A drive matrix for selectively energizing the heater elements and for supplying power thereto is located in the semiconductor wafer 10 in the area 22. A suitable array of heating elements and drive matrix is described in U.S. Pat. No. 3,501,615, issued Mar. 17, 1970 in which the circuit elements in the drive matrix are integral within the semiconductor wafer 10. The heating element array and the drive matrix are also interconnected in the desired circuit configuration by the metallic connecting pattern (not shown) underneath the wafer 10.

The wafer 10 (FIG. 3) with the mesas 12 therein is mounted upon a support such as, for example, a ceramic substrate 26 with bonding pads located above openings 28 formed in the substrate 26 so that external connection can be made with these bonding pads through the openings. An adhesive epoxy may be used, for example, to join the wafer 10 and substrate 26. The metallized pattern located between the semiconductor wafer 10 and the ceramic substrate 26 which mechanically and electrically joins the dielectrically isolated mesas 12 and electrically connects them to the circuit elements of the drive matrix is supported in the epoxy adhesive resting between the semiconductor wafer 10 and the supporting substrate 26.

The actual operation of the thermal printer may be accomplished by various techniques and is not restricted to any one method of excitation of the appropriate heating element. For example, a short high-power pulse may be applied selectively to leads of the metallized lead pattern, the pulse causing current to flow through the transistor-resistor pair 46–48 (FIG. 2) of selected printing elements, the selected printing elements heating up to say 300° C. in a pattern corresponding to the letter or number to be printed. The selection of the proper leads to be energized may be accomplished manually or by a separate diode digital decoder, for example. Thus, select elements of the array of mesas 12 may be heated to define numbers or letters of the alphabet which are then printed on heat sensitive paper which has been indexed over the surface of the thermal print head or on heat sensitive ribbon which transfers print to regular type paper. Depending upon the interconnection scheme used, the printing may be accomplished, for example, by simultaneously heating select elements thereby printing a whole line at a time, or by heating the select elements of the characters in a manner sequentially printing out the desired information.

With reference to FIGS. 4 and 4A-E, there is now described the fabrication of a print head utilizing the embodiment of this invention. The moats 14 are formed in a wafer 10, for example, monocrystalline silicon which is crystallographically oriented to expose an upper surface parallel to a {100} plane and having the usual {110} oriented flat. It will be understood that other orientations can be used to obtain other moat configurations. The wafer 10 is predominately of p-type conductivity and has a resistivity of 2 to 5 ohm-centimeters, provided by boron doping, for example. Other semiconductors and other dopants are also useful, as will be apparent to those skilled in the art. The surface of the silicon wafer 10 is oxidized, for example, by heating at about 1,000° C. in a flow of oxygen or steam to form a layer 32 of silicon dioxide on the surface. A typical oxide thickness of about 10,000° (0.04 mils) is produced by heating in steam for 4 hours.

Figure 4:
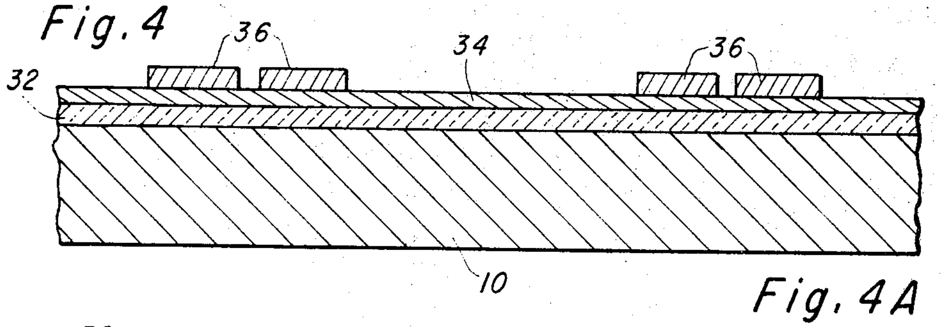
FIGS. 4, 4A—E are sectional views showing the steps in the fabrication of the print head embodying the features of the invention.
Figure 4A:
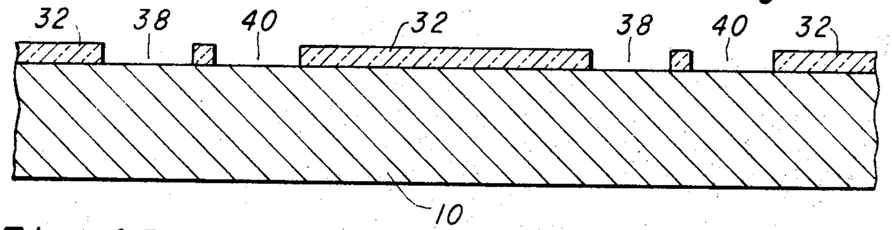
Figure 4B:
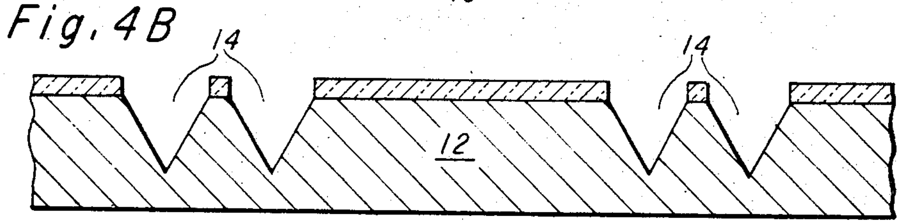

The oxide 32 is then selectively removed by the well-known photolithographic process using photoresist material. Briefly stated, this technique includes coating the oxidized surface with a thin layer of photoresist lacquer 34; a photographic mask 36 is aligned parallel to the (111) intersects of the {100} surface (parallel and perpendicular to the {110} flat). The photographic mask is patterned to provide two opaque rings, one concentric to the other for defining each mesa 12 to be formed. After exposure of the photoresist by ultraviolet light, the photoresist covered by the two opaque rings is removed by a solvent, and after baking to harden the remaining photoresist, the wafer 10 is immersed in a hydrofluoric acid solution to etch away the silicon oxide and form the silicon oxide layer 32 two properly oriented ring windows 38 and 40 (FIG. 4A). It has been found that for most thermal print head applications two windows having an overall width of 6 mils spaced 0.3 mil apart will provide a "W"-shaped "moat" 14 sufficient to provide the necessary electrical and thermal isolation of the heating unit. The masked wafer is then subjected to 285° C. to an orientation-dependent etch solution consisting, for example, of 250 grams of potassium hydroxide dissolved in a mixture of 250 millileters of propanol and 800 millileters of water. The exposed silicon of the silicon wafer 10 is etched away down to the intersection of the (111) planes (FIG. 4B). For the example given, a "W"-shaped moat 14 is formed in the silicon wafer having a depth of 2.01 mils. Thus, the mesas 12 formed by these moats 14 have a height of 2.01 mils. After the mesas are formed, the remaining masking material may be removed and the top surface of the slice is covered with a wear resistant coating 16 (FIG. 4C) of a wear resistant material such as, for example, silicon carbide, silicon nitride, or silicon dioxide, or a combination thereof.

Methods of depositing the wear resistant material are well-known to those skilled in the art. One method of depositing a silicon carbide coating utilizes an apparatus having a reactor in the form of a furnace having heating coils. The furnace may be of a horizontal or vertical type, may be suited for single or multiple slices, and may be either resistively or inductively heated. Silicon wafers or slices 10 with the mesas formed therein are disposed within the furnace in such a position as to expose the slices to gas directed into the tube through a conduit. Toluene ($C_7H_8$) and silicon tetrachloride ($SiCl_4$) vapors are respectively introduced into the conduit from cylinders containing liquid toluene and liquid silicon tetrachloride through which hydrogen gas is bubbled. Purified, dried hydrogen enters one end of the conduit. The flow of gases into the tube furnace is regulated by conventional valves. The rate of deposition is determined largely by the temperatures which the reactor is maintained, the flow rate through the conduit and the percentage composition of the constituents. For example, when the flow rate was kept at approximately 10 liters per minute, the temperature at approximately 1,080° C., and the reactive mixture consisted of 0.87 mil percent $SiCl_4$ and 0.18 percent $C_7H_8$ in hydrogen, a layer of silicon carbide was deposited upon wafer 10 at a rate of approximately 1 micron per minute.

After the silicon carbide layer 16 has been deposited over the mesas 12 and moats 14, a layer 44 (FIG. 4D) of material, for example, polycrystalline semiconductor material is deposited over the top surface of the slice 10 adjacent the silicon carbide layer 16. The most common method of deposition is by the hydrogen reduction of silicon tetrachloride, a technique well known in the art and requiring no elaboration here. The conductivity type of the layer is not critical; the crystalline structure may also be either polycrystalline or amorphous, and should be perhaps 6 or 8 mils or more in depth to facilitate handling.

Figure 4C:
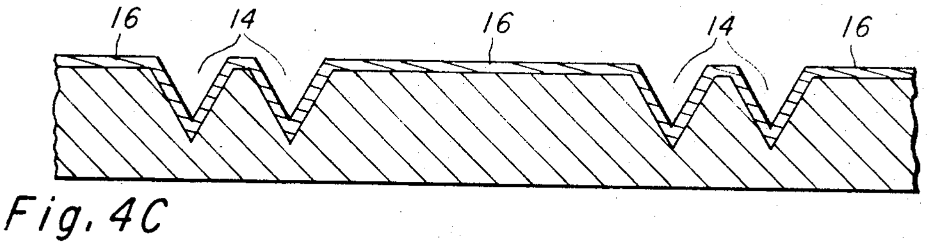
Figure 4D:
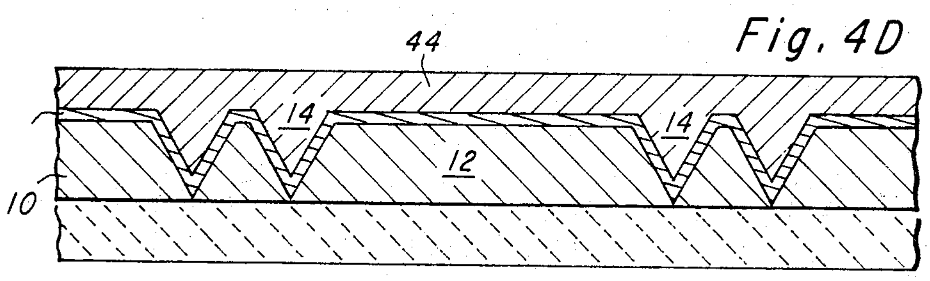

As the next step in the fabrication of the thermal printing head, the wafer 10 of FIG. 4D is subjected to a lapping and polishing treatment on its lower surface to remove all the original silicon material except that portion remaining within the mesas defined by the moats. It is to be noted at this point that the silicon carbide coating 16 functions as a substantial continuous "stop" to the lapping and polishing operation enabling precision control to be maintained over the amount of semiconductor material left within the mesa regions. This is important for a variety of reasons: it has been found that as a consequence of the various steps preceding the lapping operation, the silicon slice will bow, presenting a somewhat convex or concave surface to the lapping apparatus, and thus when lapped and polished a considerable number of the mesas will be cut through and destroyed; further, because of the precision control that can be maintained, the actual thickness of the semiconductor material within the mesa regions may be controlled to a precise degree. This latter factor is important since the thickness of each of the mesas influences their rate of heating and cooling (in other words the thermal response) which in turn determines the speed of the printing.

Figure 4E:
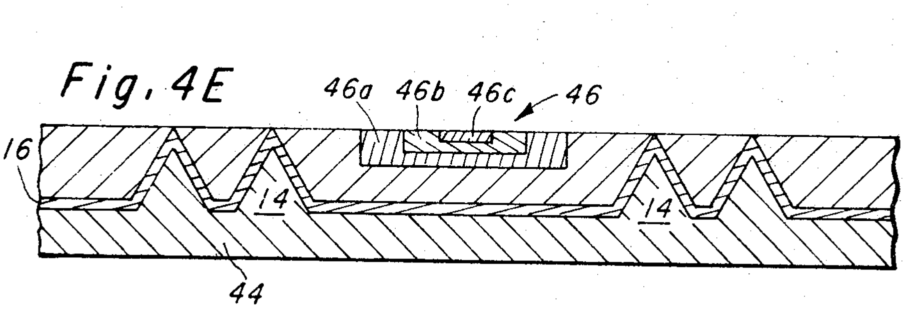

The next step is to invert the structure and, looking at what was the bottom or lower surface of the wafer 10 of FIG. 4D, but what will now be considered the top face of the unit, the structure appears as in FIG. 4E. Mesa regions 12 now serve as regions into which subsequent diffusions or implantations, or upon which epitaxial depositions may be made in order to fabricate, for example, the transistor-resistor 46–48 of each heating element. In this particular embodiment, the transistor-resistor pair 46–48 is formed by conventional oxide masking and diffusion operations in the semiconductor material of the mesas which as shown is a p-type conductivity.

Figure 5:
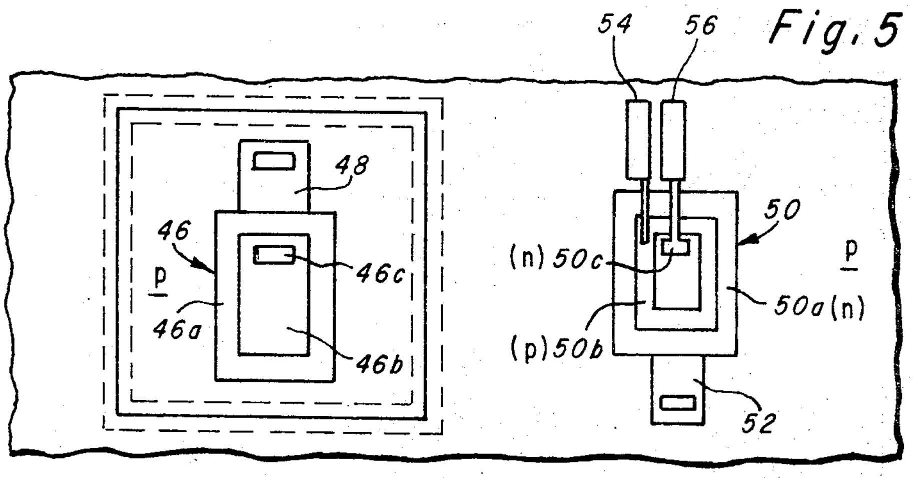
FIG. 5 is a fragmentary plan view of the print head heating element and associated drive transistor embodying the features of the invention.

The transistor 46 (FIG. 5) of the transistor-resistor pair 46–48 comprises a diffused n-type collector region **46*a*, a diffused p-type base region 46*b*, and a diffused n-type emitter region 46*c*. The resistor 48 of the transistor-resistor pair comprises, for example, a diffused n-type region made at the same time as the n-type collector diffusion and integral therewith so that one end of the resistor 48 is ohmically connected to the collector 46*a* internally of the semiconductor material. A drive transistor 50 may be formed outside the array of mesas 12 for each transistor-resistor pair 46–48. Each drive transistor 50 comprises an n-type collector region 50*a*, p-type base region 50*b* and an n-type diffused emitter region 50*c*. Each drive transistor 50 has associated therewith: a collector resistor 52 comprising an n-type diffused region made at the same time as the respective collector diffusion of the drive transistor 50 in the manner that one end of the collector resistor 52 is integral with the collector 50*a* of its associated collector resistor 52; a base resistor 54 comprising the p-type region in the surface of the semiconductor wafer 10 connected to the base 50*b* of the respective drive transistors; and an emitter resistor 56** comprising a diffused n-type region in the surface of the semiconductor wafer connected to the emitter electrode.

The transistor-resistor pairs 46–48 for the heating elements are formed in the mesas 12 and the drive transistors 50 and associated resistors 52, 54 and 56 are formed in the wafer 10 outside of the mesa array as in the planar process in which an oxide film is thermally grown on the p-type wafer of the desired resistivity by placing it in a furnace at an elevated temperature and passing an oxidizing agent over it. The resulting silicon dioxide layer acts as a masking medium against the impurities which are later diffused into the wafer 10. Windows are produced in the oxide film to allow subsequent diffusion processes to form the transistors and resistors. The windows which are patterns of the desired circuit elements are produced, for example, by photolithographic techniques or other suitable circuit element techniques such as ion beam implantation techniques. Contacts and interconnections between the circuit elements may be made, for example, by similar photolithographic techniques using evaporated aluminum over the oxide to form a metallic pattern connecting the circuit elements together and terminating in bonding pads for external connections. The connecting pattern comprises conductive strips on the oxide film extending into windows in the oxide film for providing the desired connections. As the techniques for forming the elements as described herein are well known to those skilled in the art, further description is not included.

The array of mesas 12 is then inverted again and mounted upon, e.g., a ceramic substrate 26 (FIG. 3) with a suitable adhesive, such as, an epoxy. The wafer is attached with the mesa printing elements aligned so that the heating elements and associated drive element contact pads are over openings 28 in the ceramic substrate to which they may be joined by external leads inserted through the openings.

Finally, the polycrystalline layer is partially, or completely, removed, resulting in a structure shown in FIGS. 2 and 3, whereby each of the mesa thermal printing elements are isolated from each other by the dielectric layer of, for example, silicon carbide, silicon nitride, or silicon dioxide and polycrystalline silicon formed in the moats 14. This is accomplished by applying an etchant such as a mixture of hydrofluoric acid (2 parts per volume), nitric acid (15 parts per volume) and acetic acid (5 parts per volume) to the top surface, whereby all of the polycrystalline material is etched away, while the semiconductor material within the individual mesas and the lead metallization between the mesas are protected from the etchant by the layer of silicon carbide 16 acting as an etch barrier.

As the result of the above-described process, an array of mesas, including heating elements with associated drive elements, is produced. The complete structure provides numerous advantages. The transistor-resistor pair of each element is positioned away from the surface over which the thermal sensitive paper passes, the silicon material within the mesas and the silicon carbide coating provides the protection for these components. The final structure, even without the silicon carbide coating, will offer considerable wear resistance, the silicon material itself affording substantial protection from the abrasive action of the thermal sensitive paper. The presence of the carbide layer, however, affords the best protection for the components, the interconnects, and the overlying silicon material. In addition, since the interconnections are also formed away from the upper surface, they will be protected, providing greater reliability.

The removal of the polycrystalline material from the "W"-shaped moats between each mesa provides thermal and electrical isolation between each of the printing elements, thereby reducing heat "spill overs" into the adjacent elements, thus keeping the power required to heat such elements at a minimum and producing maximum sharpness in print quality.

Figure 6:
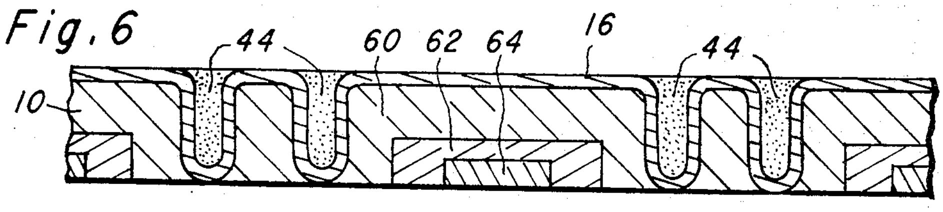
FIG. 6 is a fragmentary view showing in cross section an island array constituting another embodiment of the invention.

Turning now to the embodiment of the invention shown in FIG. 6, with certain exceptions, the method steps employed to fabricate the mesa array are used to fabricate islands for a power device. In power devices, the distance between the islands is less critical, hence a non-preferential etch solution is used as a matter of choice, e.g., where 111 slices are being used, to form at least two concentric channels for the moat rings. In this case the wafer 10 is patterned to accommodate the undercutting under the mask by the etching solution. Further, the layer 44 of polycrystalline semiconductor material is removed, for example, by etching or lapping sufficiently to form a planar surface with the islands. The power device may be a transistor 60, for example, which uses the wafer 10 semiconductor material forming the island as the collector; the base 62 is formed by diffusion or other suitable techniques in the island without removing the coating 16 if of silicon nitride to obtain the advantages of nitriding the transistor, or after removal of the coating 16, in the top of the island. The emitter 64 of the transistor 60 is then formed, for example, by diffusion or other suitable techniques in the base 62.

Although a detailed description of a preferred embodiment of this invention has been described, it will be apparent to a person skilled in the art that various modifications to the details of construction shown and described may be made without departing from the scope of this invention.

What is claimed is:

1. A thermal print head comprising:

a. a plurality of spaced mesas forming an array in a substrate of semiconductor material;

b. circuit means within each of selected mesas for heating the mesas;

c. circuit control means in said substrate for selectively actuating said circuit means for heating the mesas; and d. a moat having a plurality of adjoining channels separating each mesa one from the others, the moat forming air gaps and surface areas exposed to the air for thermally and electrically isolating the plurality of mesas one from the others whereby said moat is made wide enough to prevent temperature bleeding from one mesa to another and sufficiently shallow to prevent breakage through normal usage of the thermal print head.

2. A thermal print head according to claim 1 wherein the plurality of adjoining channels forming air gaps and surface areas exposed to the air are interconnected concentric "V"-shaped grooves forming a moat having a "W"-shaped cross-section.

3. An array of mesas according to claim 2 wherein the wafer of semiconductor material is silicon having a surface crystal orientation in the {100} plane, and the "W"-shaped moat is formed by the intersection of {111} planes.

* * * * *